(12) United States Patent
Burtner et al.

(10) Patent No.: US 7,718,983 B2
(45) Date of Patent: May 18, 2010

(54) SPUTTERED CONTAMINATION SHIELDING FOR AN ION SOURCE

(75) Inventors: David Matthew Burtner, Fort Collins, CO (US); Daniel E. Siegfried, Fort Collins, CO (US); Richard Blacker, Farmington Hills, MI (US); Valery Alexeyev, Moscow (RU); John Keem, Bloomfield Hills, MI (US); Vsevolod Zelenkov, Moscow (RU); Mark Krivoruchko, Zelenograd (RU)

(73) Assignee: Veeco Instruments, Inc., Plainview, NY (US)

( * ) Notice: Subject to any disclaimer, the term of this patent is extended or adjusted under 35 U.S.C. 154(b) by 1675 days.

(21) Appl. No.: 10/918,865

(22) Filed: Aug. 16, 2004

(65) Prior Publication Data

US 2005/0040031 A1    Feb. 24, 2005

Related U.S. Application Data

(60) Provisional application No. 60/496,886, filed on Aug. 20, 2003.

(51) Int. Cl.
*G21F 5/00* (2006.01)
(52) U.S. Cl. ............ 250/515.1; 250/492.1; 250/492.21; 250/492.3; 250/493.1; 250/423 R; 315/111.81
(58) Field of Classification Search .............. 250/492.1, 250/492.21, 492.3, 493.1, 515.1, 423 R; 315/111.81
See application file for complete search history.

(56) References Cited

U.S. PATENT DOCUMENTS

| | | | |
|---|---|---|---|
| 4,351,712 A * | 9/1982 | Cuomo et al. .......... | 204/192.34 |
| 4,481,062 A | 11/1984 | Kaufman et al. | |
| 5,640,020 A | 6/1997 | Murakoshi et al. | |
| 5,763,989 A | 6/1998 | Kaufman | |
| 6,002,208 A | 12/1999 | Maishev | |
| 6,037,717 A | 3/2000 | Maishev | |
| 6,130,507 A | 10/2000 | Maishev | |

(Continued)

FOREIGN PATENT DOCUMENTS

EP    1130623 A1    9/2001

(Continued)

OTHER PUBLICATIONS

Dr. John Keem, High Current Density Anode Layer Ion Sources, 44th Annual Technical Conference Proceedings, 2001, pp. 1-6, Society of Vacuum Coaters.

(Continued)

*Primary Examiner*—Rodney G McDonald
(74) *Attorney, Agent, or Firm*—Hensley Kim & Holzer, LLC

(57) ABSTRACT

Shielding associated with an ion source, such as an anode layer source, reduces the amount and/or concentration of sputtered contaminants impinging and remaining on the surface of a target substrate. While passing the ion beam through to the target substrate, shielding can reduce the total amount of sputtered contaminants impinging the substrate before, during, and/or after passage of the substrate through the envelope of the etching beam. Particularly, a shield configuration that blocks the contaminants from impinging the substrate after the substrate passes through the etching beam (i.e., outside of the envelope of the etching beam) yields a higher quality substrate with reduced substrate contamination.

50 Claims, 6 Drawing Sheets

U.S. PATENT DOCUMENTS

| | | | |
|---|---|---|---|
| 6,147,354 | A | 11/2000 | Maishev |
| 6,153,067 | A | 11/2000 | Maishev |
| 6,214,183 | B1 | 4/2001 | Maishev |
| 6,236,163 | B1 | 5/2001 | Maishev |
| 6,238,526 | B1 | 5/2001 | Maishev |
| 6,242,749 | B1 | 6/2001 | Maishev |
| 6,246,059 | B1 | 6/2001 | Maishev |
| 6,250,250 | B1 | 6/2001 | Maishev |
| 6,359,388 | B1 | 3/2002 | Petrmichl |
| 6,368,664 | B1 | 4/2002 | Veerasamy |
| 6,395,333 | B2 | 5/2002 | Veerasamy |
| 6,454,901 | B1 | 9/2002 | Sekiya |
| 6,454,910 | B1 | 9/2002 | Zhurin |
| 6,777,030 | B2 | 8/2004 | Veerasamy |
| 6,808,606 | B2 | 10/2004 | Thomsen |
| 6,815,690 | B2 | 11/2004 | Veerasamy |
| 2002/0163289 | A1 | 11/2002 | Kaufman et al. |

FOREIGN PATENT DOCUMENTS

| | | |
|---|---|---|
| JP | 406111755 A | 4/1994 |

OTHER PUBLICATIONS

D. Burtner, Linear Anode-Layer Ion Sources With 340- and 1500-mm Beams, 46th Annual Technical Conference Proceedings, May 2003, pp. 61-66, Society of Vacuum Coaters.

V. Dudnikov, Ion Source With Closed Drift Anode Layer Plasma Acceleration, Review of Scientific Instruments, Feb. 2002, pp. 729-731, vol. 73 No. 2, American Institute of Physics.

V. Zhurin, Physics of Closed Drift Thrusters, Plasma Sources Sci. Technol. 8, 1999, pp. R1-R20, IOP Publishing Ltd., UK.

N. Vershinin, Hall Current Accelerator For Pre-Treatment of Large Area Glass Sheets, Coatings on Glass, 1999, pp. 283-286.

V. Baranov, Energy Model and Mechanisms of Acceleration Layer Formation For Hall Thrusters, 33rd Joint Propulsion Conference, Jul. 1997, pp. 1-8, AIAA 97-3047, Reston, VA.

A. Zharinov, Acceleration of Plasma by a Closed Hall Current, Soviet Physics—Technical Physics, Aug. 1967, pp. 208-211, vol. 12 No. 2, Russia.

A. Semenkin, Investigation of Erosion in Anode Layer Thrusters and Elaboration High Life Design Scheme, 23rd Intl Electric Propulsion Conf., Sep. 1993, pp. 1-6, IEPC-93-231.

L. Lou, Application Note: Ion Source Precleaning, Advanced Energy, Mar. 2001, pp. 1-4, Fort Collins, CO.

Plasma Surface Engineering Corporation, Compound Ion Beam-Magnetron Sputtering Source, Product Specification: I-Mag, Feb. 2003, pp. 1-5, San Diego, CA.

A. Shabalin, Whitepaper: Industrial Ion Sources and Their Application for DLC Coating, SVC 42nd Annual Technical Conference, Jan. 2001, pp. 1-4, Fort Collins, CO.

Advanced Energy, Ion Beam Sources, [online], Aug. 2002, [retrieved on Dec. 6, 2004], Retrieved from the Advanced Energy company website using Interent <URL:http://www.advanced-energy.com/upload/sl-ion-230-02.pdf>, pp. 1-6, Fort Collins, CO.

VECOR, Vacuum Equipment Coatings and Optics from Russia, [online], last updated on Apr. 22, 2004, [retrieved on Dec. 6, 2004], Retrieved from the Advanced Energy company website using Internet <URL: http://www.vecorus.com/welcom.htm>, Moscow, Russia.

VECOR, Vacuum Equipment Coatings and Optics from Russia, Magnetrons Ion Sources and Accessories, [online], last updated on Apr. 22, 2004, [retrieved on Dec. 6, 2004], Retrieved from the Advanced Energy company website using Internet <URL:http://www.vecorus.com/magionsource.htm>, Moscow, Russia.

* cited by examiner

SPUTTERED CONTAMINATION SHIELDING FOR AN ION SOURCE

RELATED APPLICATIONS

This application claims benefit of U.S. Provisional Application No. 60/496,886, entitled "Sputtered Contamination Shielding for an Ion Source" and filed Aug. 20, 2003, incorporated herein by reference for all that it discloses and teaches.

TECHNICAL FIELD

The invention relates generally to ion sources, and more particularly to shielding for an ion source.

BACKGROUND

Generally, an ion source is a device that ionizes gas molecules and focuses, accelerates, and emits the ionized gas molecules and/or atoms in a beam for a variety of technical and industrial applications. For example, ion sources may be used as thrusters on space craft. Ion sources are also used in semiconductor material and device processing, optical filter processing, and metrology, among other applications. Common uses of ion sources include without limitation cleaning, assisting deposition (by chemically or physically activating), polishing, etching and/or depositing of thin-film coatings. Typically, a substrate is passed through an ion beam (e.g., an etching beam) for such processing.

An anode layer source (ALS) typically refers to a Hall-current type ion source having a grounded cathode and a DC-biased anode. The working gas is fed into an ionization region in the vicinity of the anode and the cathode, where the combination of electric and magnetic fields in this region ionizes the molecules of the working gas and accelerates each ion away from the ionization region toward a target. The ionization region generally forms a closed-loop (e.g., a race track shape) in the face of the ion source. The shape of this closed-loop "race track" may be round, oval, linear with rounded ends, or many other closed shapes.

One benefit to an ALS is that an ALS does not require a hot cathode electron source (e.g., filament cathode, hollow cathode, or RF neutralizer) with a separate power supply to sustain the plasma. ALS cathodes are passive, cold cathodes, typically made of steel. The cathodes also function as pole pieces for the ALS magnetic circuit. The cold cathodes do not actively emit electrons, but ions bombarding the cathodes release secondary electrons that help to sustain the discharge.

One problem with an ALS, however, is that the ions striking the cathodes can also sputter material from the cathodes. The sputtered cathode material may enter the process as a contaminant. Such cathodes are typically steel or magnetic stainless steel, so the primary contaminant is iron, although other contaminants may also exist. The sputtered material tends to emit across a wide range of angles. As a result, the sputtered material tends to impinge the substrate surface outside the envelope of the etching beam as well as inside the envelope of the etching beam. Depending on the type of ion source, the operating regime, and the application, there may be other ion source electrodes or adjacent components that also sputter in a similar matter and contribute to substrate contamination.

Most contaminants impinging the substrate surface prior to and during the passing of the substrate through the etching beam are etched away by the beam. However, the contaminants that impinge the surface of the substrate after the substrate has passed through the etching beam remain as contaminants. In other words, a substrate tends to acquire a new layer of contaminants after exiting the envelope of the ion beam. Therefore, for example, etching a substrate using an ALS may yield an etched substrate having an unacceptable concentration of iron contaminants sputtered from the ALS itself.

SUMMARY

Implementations described and claimed herein solve the discussed problems by providing shielding associated with an ion source, such as an ALS. The shield configuration allows the etching ions to pass to the substrate and effectively blocks sputtered contaminants from impinging the target substrate outside the envelope of the etching beam.

Such shielding associated with an ion source reduces the number of sputtered contaminants impinging and remaining on the surface of a target substrate. While passing the ion beam through to the target substrate, shielding can reduce the total number of sputtered contaminants impinging the substrate before, during, and/or after passage of the substrate through the envelope of the etching beam. Particularly, a shield configuration that blocks the contaminants from impinging the substrate after the substrate passes through the etching beam (i.e., outside of the envelope of the etching beam) yields a higher quality substrate (i.e., with lower contamination levels).

In one implementation, an ion source system for processing a substrate along a substrate location path is provided. An ion source generates an ion beam. A shield is positioned between the ion source and the substrate location to pass the ion beam to the substrate while blocking sputtered contaminants from impinging the substrate.

In another implementation, a shielding system positionable between an ion source and a substrate location is provided. The shielding system passes an ion beam from an ion source to impinge a substrate on the substrate location while blocking sputtered contaminants from impinging the substrate.

In yet another implementation, a method of processing a substrate is provided. An ion beam is generated and sputters ions from an ion source having a cathode, the ion beam defining an envelope. The substrate passes through the envelope. Sputtered contaminants are sputtered from the cathode by the sputtering ions. The sputtered contaminants are blocked from impinging the substrate outside of the envelope of the ion beam.

In yet another embodiment, an ion source system includes an ion source; and means for passing an ion beam from the ion source to impinge a substrate while blocking sputtered contaminants from impinging the substrate.

DETAILED DESCRIPTION OF THE INVENTION

Using shielding in association with an ion source can reduce the total number of sputtered contaminants striking and remaining on the surface of a target substrate. A shield configuration can block the sputtered contaminants from impinging the substrate outside the envelope of the ion beam. Many, but not all, contaminants that impinge the substrate during (and prior to) the passage of the substrate through the envelope of the etching beam are etched away from the substrate by the beam. In one implementation, blocking such contaminants from impinging the substrate surface after the substrate passes through the etching beam (i.e., outside of the envelope of the etching beam) significantly reduced contamination of the substrate surface, although generally reducing the number of sputtered contaminants reaching the surface of the substrate improves substrate quality as well (e.g., resulting in about a 50% reduction in substrate contamination).

Figure 1:
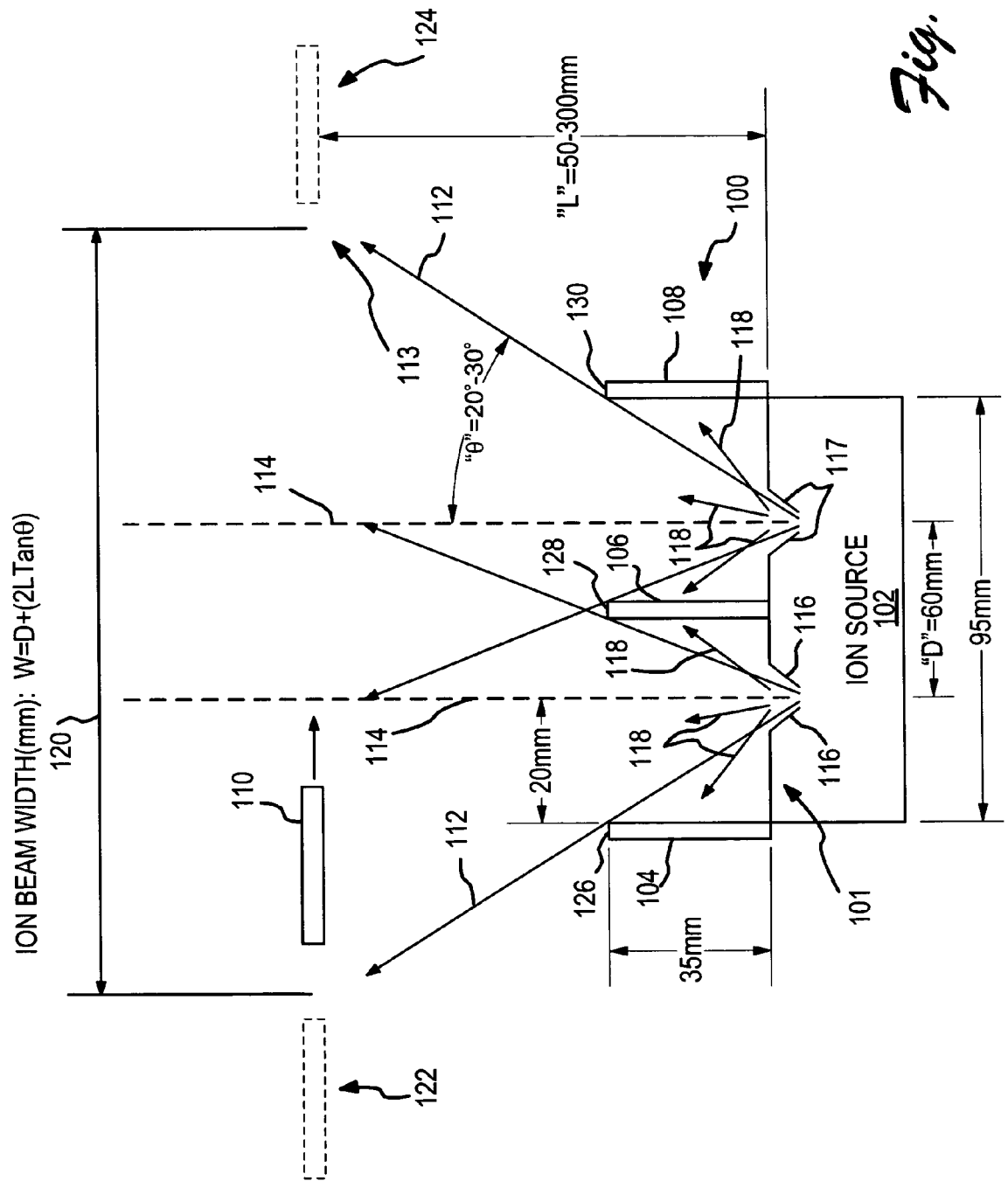
FIG. 1 illustrates a cross-sectional schematic view of an ion source with exemplary emitter shields.

FIG. 1 illustrates a cross-sectional schematic view of an ion source with exemplary emitter shields, which are adjacent to the ion source. An ion source processing system 100 includes an ion source 102, and emitter shields 104, 106, and 108. The target of the processing is a substrate 110, which is positioned or passed at some distance from the emission face 101 of the ion source 102. The ion source 102 produces an ion beam on an ion beam axis 114, where an ion beam envelope is defined by arrows 112 and the ion beam axis 114 is substantially perpendicular to the emission face 101. The substrate 110 is passed through the ion beam envelope 112, substantially perpendicular to the ion beam axis 114, although geometries with non-perpendicular ion beam emission and/or impingement are also contemplated. In addition, ion beam emission intensity and direction may be different for different portions or sides of the ionization region. In a typical configuration, multiple substrates are passed sequentially through the ion beam for processing along this perpendicular path, although other configurations may involve one or more stationary substrates.

Figure 5:
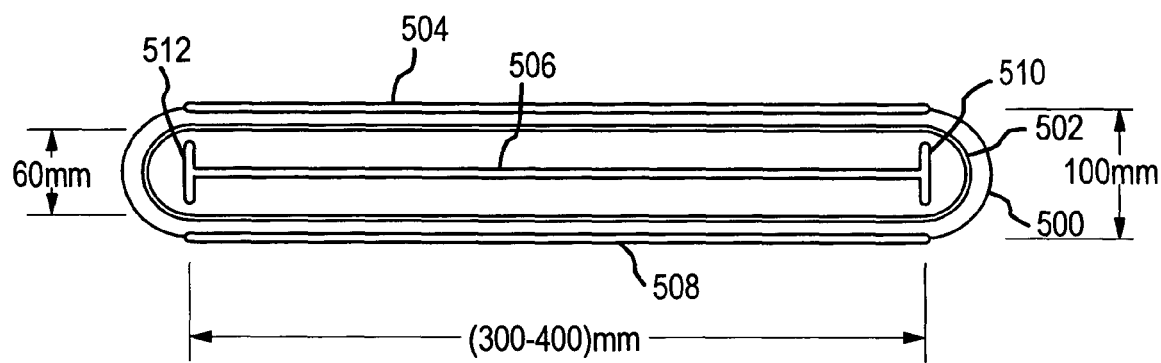
FIG. 5 illustrates a face of an ion source with exemplary emitter shields.
Figure 6:
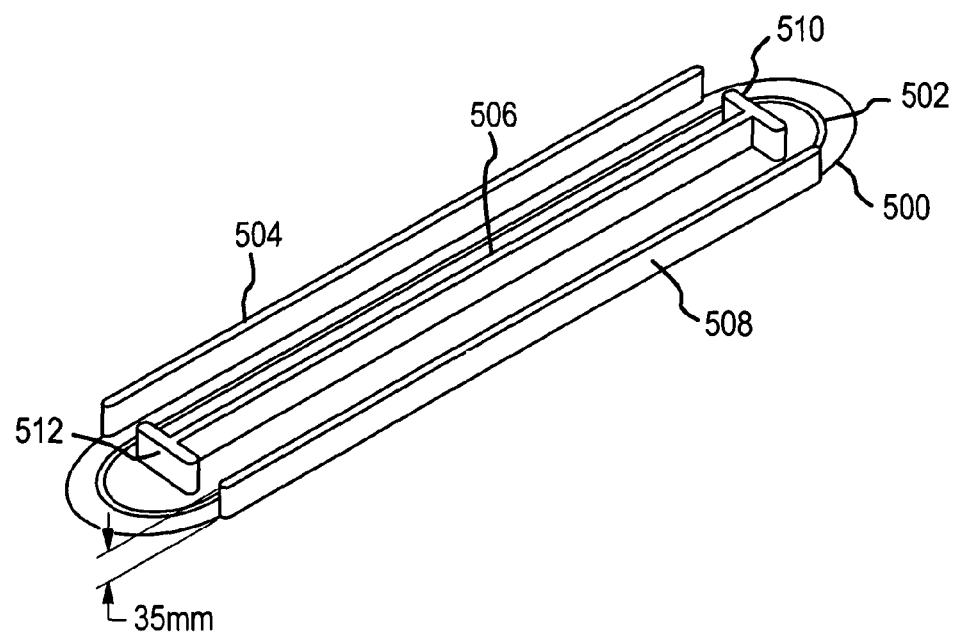
FIG. 6 illustrates a perspective view of the ion source of FIG. 5 with exemplary emitter shields.

In one exemplary type of ALS, called a linear ALS, the ion beam is linear (e.g., long and narrow) as defined by a closed oval ionization region or channel with long, straight sides (see, for example, FIGS. 5 and 6). Typical applications of linear ALS systems include processing large flat substrates with substrate motion generally perpendicular to the longitudinal axis of the beam (i.e., perpendicular to the straight section of the ionization channel). Linear ALS systems, other types of ALS systems, and other types of ion beam sources may benefit from the described technology.

Some generated ions (i.e., sputtering ions) impinge the cathodes 116 and 117, causing cathode material to sputter (shown by arrows 118) from the cathodes 116 and 117. The sputtered material can enter the process as a contaminant on the surface of the substrate 110. For example, absent the shields 104, 106, and 108, when the substrate 110 is in positions 122 and 124, sputtered material from the cathodes 116 and 117 may impinge the substrate 110, thereby contaminating the surface of the substrate 110. In addition, regardless of the presence of the shields 104, 106, and 108, sputtered material from the cathodes 116 and 117 may impinge the substrate 110 while passing through the width 120 of the ion beam on the substrate path. The ion beam width is dependent upon the envelope defined by edges of the ion beam and the distance between the ionization region of the ion source and the substrate path.

A substantial amount of the sputtered contaminants impinging the surface of the substrate 110 before (e.g., at position 122) and during passage of the substrate 110 through the ion beam is etched away by the beam. Some such contaminants remain. Therefore, reducing the total amount of contaminants impinging the surface of the substrate can improve the quality of the substrate. Furthermore, any contaminants impinging the surface of the substrate 110 after passage through the far edge of the ion beam envelope 112 (e.g., see general location referenced by arrow 113) remain on the surface because none are etched away. Therefore, reducing the amount of contaminants impinging the surface of the substrate after passage through the ion beam can reduce substrate contamination.

By positioning shields 104, 106, and 108 to block sputtered contaminants that are directed outside of the envelope of the ion beam, the sputtered contaminant count is dramatically reduced on the surface of the substrate 110. The outside shield 104 extends upright (i.e., at a greater than 0° angle to a 90° angle) from the face of the ion source 102 and is positioned outside and along one of the long channels of the ionization region of the ion source. The outside shield 104 blocks sputtered contaminants emitted to the left in FIG. 1 from the cathodes 116 of the ion source 102. The end point 126 of the outside shield 104 is positioned to pass a substantial amount of the ion beam while blocking sputtered contaminants emitted outside the ion beam envelope.

The inside shield 106 blocks sputtered contaminants emitted to the right in FIG. 1 from the cathodes 116 of the ion source 102 and to the left in FIG. 1 from the cathodes 117 of the ion source 102. The inside shield 106 extends upright (e.g., at a greater than 0° angle to a 90° angle) from the emission face 101 of the ion source 102 and is positioned between the long channels of the ionization region of the ion source. The end point 128 of the inside shield 106 is positioned to pass a substantial amount of the ion beam while blocking sputtered contaminants emitted outside the inside edge portions of the envelope of the ion beam emitted from cathodes 116 and 117.

The outside shield 108 blocks sputtered contaminants emitted to the right in FIG. 1 from the cathodes 117 of the ion source 102. The outside shield 108 extends upright (e.g., at a greater than 0° angle to a 90° angle) from the emission face 101 of the ion source 102 and is positioned outside and along the other long channel of the ionization region of the ion source. The end point 130 of the outside shield 108 is positioned to pass a substantial amount of the ion beam while blocking sputtered contaminants emitted outside the ion beam envelope.

In addition, end shields (not shown in FIG. 1, but examples may be seen in FIGS. 5-8) may also be employed to block sputtered material emitted from the ends of an ALS (e.g., the curved end portions of the ionization channels 502 and 702 of ion sources 500 and 700, respectively, in FIGS. 5-8). It should be understood that the inside shields, the outside shields, and the end shields may or may not be physically attached to the ion source itself.

In some operating conditions, the shields may be sputtered the by ion beam (e.g., depending upon the height, shape, location, and composition of the shields and the shape and intensity of the ion beam). As such, shields may be fabricated out of materials that are not process contaminants, such as titanium in a titanium-oxide deposition process, and/or that have a very low sputter yield (collectively "process-compatible" materials). In addition to shield materials being sputtered into the process, some of the cathode or anode materials may be initially sputtered from the ion source to impinge the shield and then be "re-sputtered" from the shield into the process. As such, shields may be positioned with an inward tilt, provided with a louvered design, or manufactured with a honeycomb or similar structured material to trap sputtered contaminants to reduce forward sputtering of contaminant material.

Figure 2:
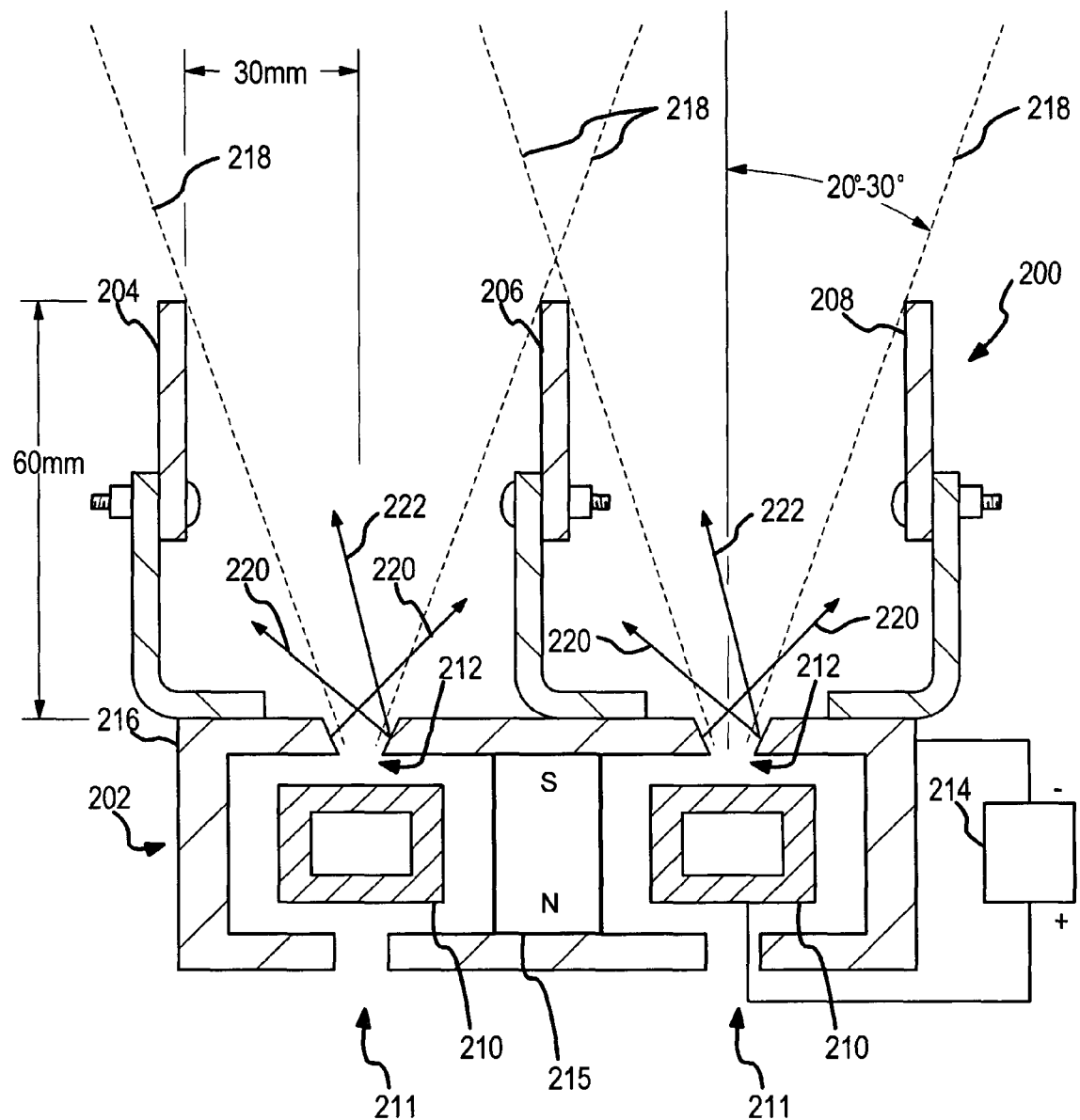
FIG. 2 illustrates a more detailed cross-sectional schematic view of an ion source with exemplary emitter shields.

FIG. 2 illustrates a more detailed cross-sectional schematic view of an ion source with exemplary emitter shields. The system 200 includes a closed-field ion source 202 and emitter shields 204, 206, and 208, which extend outward from the face of the ion source 202. (An open-field anode layer ion source may be employed in an alternative implementation. Also, implementations may be applied to end-Hall ion sources and various other ion sources. Moreover, ion sources where the edges of the contaminant distribution zone (e.g., 118 in FIG. 1) is broader than the edges of the ion beam (e.g., beam 112 in FIG. 1) may gain particular benefit from such described shielding. In addition, such ion source beam shapes may vary and may include circular shapes, annular shapes, etc.) A working gas is emitted behind the anode 210 through inlet 211, flows around the anode 210, and is ionized at an ionization region 212 through interaction of an electric field generated by the power source 214 and a magnetic field generated by permanent magnets 215. The anode 210 is made of a non-magnetic material, such as 300 series stainless steel. A cathode 216 is made of magnetic material, such as carbon steel or 400 series stainless steel. The combination of the electric field and the magnetic field creates the ions and accelerates them away from the ionization region 212, as represented by dashed beam lines 218, toward a target (e.g., a substrate).

However, some ions created at the ionization region 212 bombard the surface of the cathode 216 near the ionization region 212 and, therefore, sputter cathode material away from the ionization region 212, as represented by the exemplary directional arrows 220 and 222. The sputtered material can enter the ion beam process as a contaminant, such as by impinging the surface of the substrate.

In some ion source applications, gases that can form some negative ions as well as the usual positive ions, such as oxygen, may be used. These negative ions can sputter the anode and result in sputtered anode material entering the process as a contaminant in a manner similar to that described herein for cathode sputtering. As such, the shielding described herein may be used to block anode sputtered contaminants and other contaminants as well.

As can be seen in FIG. 2, the sputtered material corresponding to arrows 220 strikes the surfaces of the shields 204, 206, and 208, and is effectively blocked from impinging the target. In contrast, the sputtered material corresponding to the arrows 222 bypasses the shields 204, 206, and 208 and may impinge the target. However, the sputtered material corresponding to the arrows 222 remains within the envelope of the ion beam 218 and is therefore substantially etched away from the substrate by the ion beam during processing.

Accordingly, the heights of the shields 204, 206, and 208 (relative to the ionization region 212) are set to substantially block sputtered material that is emitted outside the ion beam envelope 218, while substantially allowing the ion beam (and sputtered material emitted within the ion beam envelope) to pass to the target. Likewise, the widths of the shields 204, 206, and 208 (or the distances of the shields 204, 206, and 208 from adjacent ionization regions) are set with at least the same constraints.

Figure 3:
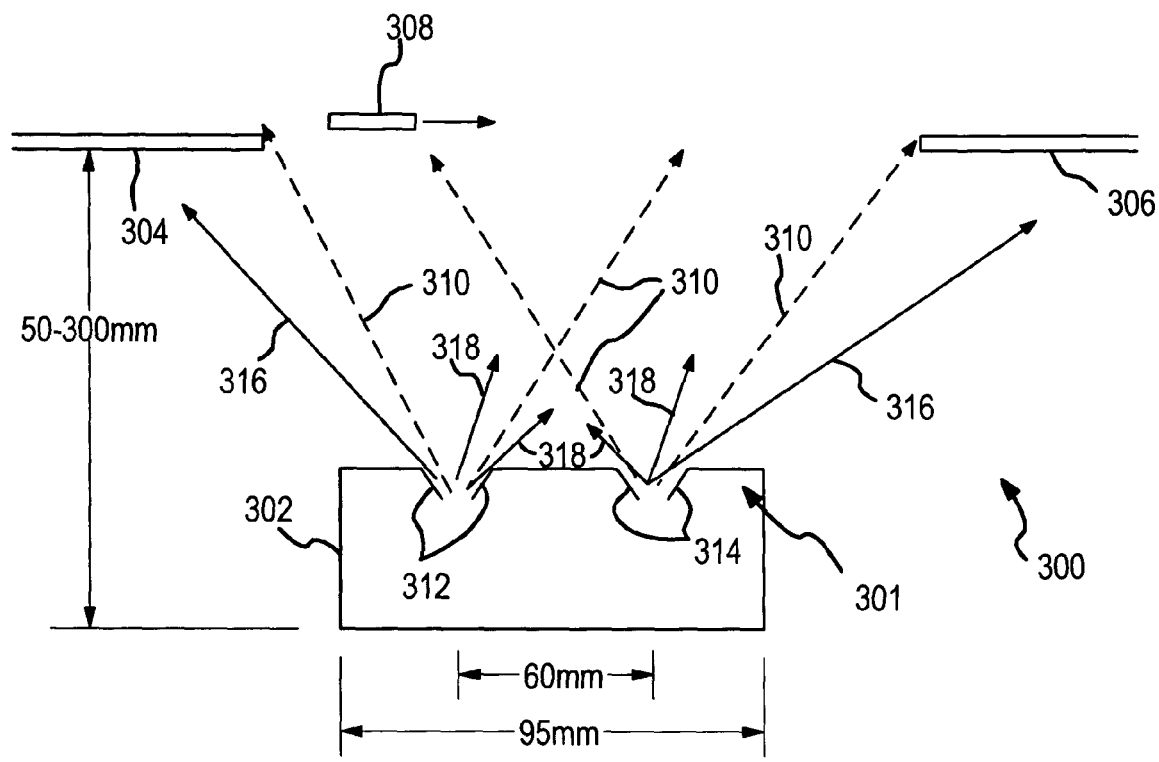
FIG. 3 illustrates a cross-sectional schematic view of an ion source with exemplary substrate shields.

FIG. 3 illustrates a cross-sectional schematic view of an ion source with exemplary substrate shields, which are adjacent to the substrate path. An ion source processing system 300 includes an ion source 302 and substrate shields 304 and 306. The target of the processing is a substrate 308, which is located or passed at some distance from the emission face 301. The substrate 308 is passed through an ion beam (defined by dashed arrows 310). In a typical configuration, multiple substrates are passed sequentially through the ion beam for processing along this path parallel to the emission face 301, although non-parallel paths may also be employed.

Some generated ions (i.e., sputtering ions) bombard the cathodes 312 and 314, causing cathode material to sputter (shown by solid arrows 316 and 318) from the cathodes 312 and 314. As mentioned earlier, cathode sputtered contaminants are just one type of contaminant material that may enter the process. Other contaminant materials may also be sputtered off of other surfaces of the ion source or enter the process through other means.

The sputtered material can enter the process as a contaminant on the surface of the substrate 308. For example, absent the shields 304 and 306, when the substrate is outside the ion beam envelope, sputtered material from the cathodes 312 and 314 may impinge the substrate 308, thereby contaminating the surface of the substrate 308. In addition, regardless of the presence of the shields 304 and 306, sputtered material from the cathodes 312 and 314 may impinge the substrate 308 while passing through the ion beam envelope. However, a substantial amount of the sputtered contaminant impinging the surface of the substrate 308 before and during passage of the substrate 308 through the ion beam is etched away by the ion beam. However, any contaminant impinging the surface of the substrate 308 after passage through the ion beam remains on the surface. By positioning shields 304 and 306 to block sputtered contaminants that are directed outside of the ion beam envelope, the sputtered contaminant count reaching the substrate is dramatically reduced on the surface of the substrate 308. It should be understood, however, that such shields may be positioned along an ion beam axis near to the substrate location, near to the emission face 301, or at some distance in between the substrate location and the emission face 301.

Figure 4:
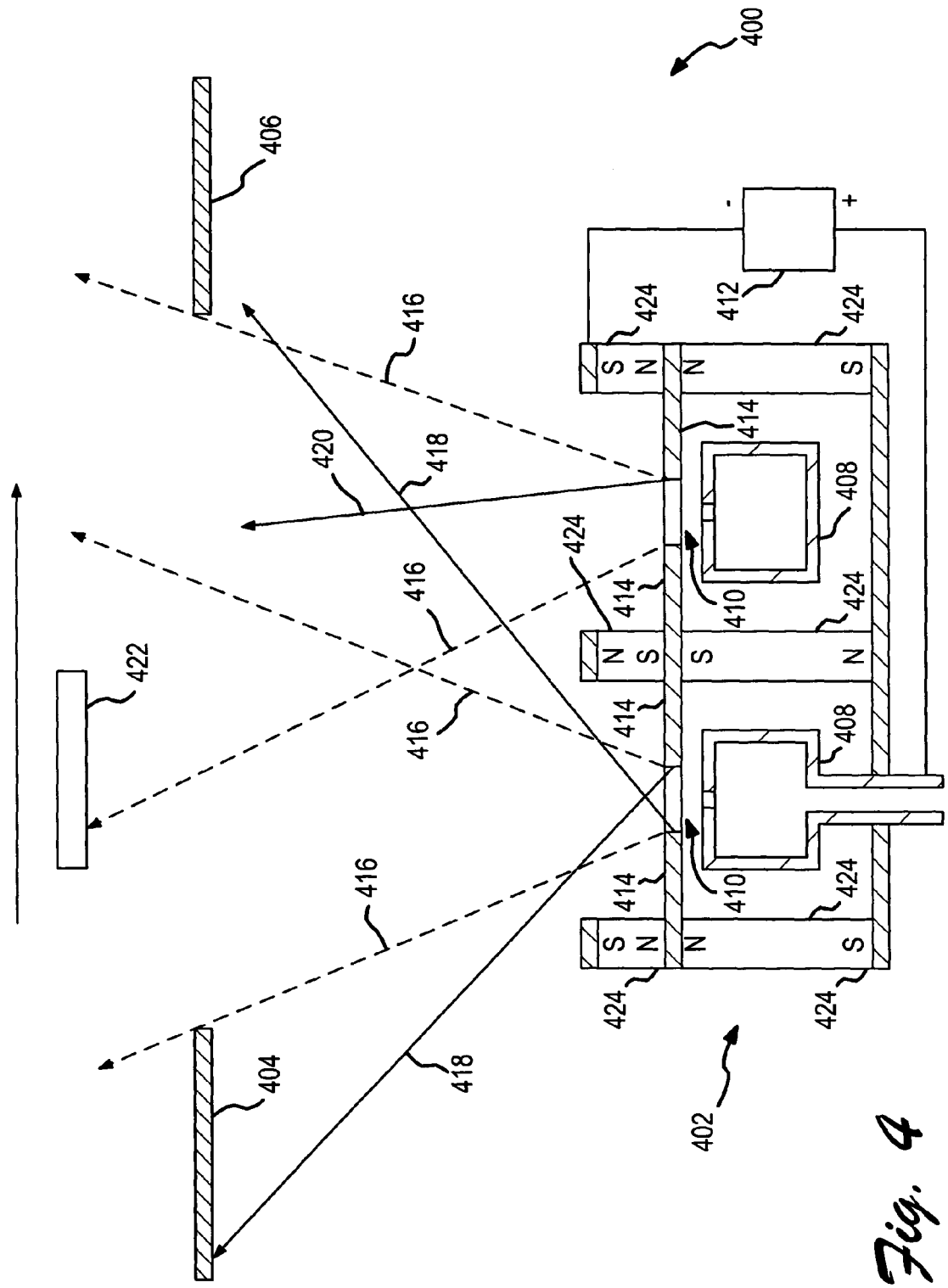
FIG. 4 illustrates a more detailed cross-sectional schematic view of an ion source with exemplary substrate shields.

FIG. 4 illustrates a more detailed cross-sectional schematic view of an ion source with exemplary substrate shields. The system 400 includes an open-field ion source 402, although a closed-field ion source may be employed in an alternative implementation. The system 400 also includes substrate shields 404 and 406, which are positioned substantially parallel to the face of the ion source 402 (although non-parallel configurations are also contemplated). A working gas is emitted from the anode 408 and ionized at the ionization region 410 through the interaction of an electric field generated by the power source 412 and a magnetic field generated by permanent magnets 424. The anode 408 is made of a non-magnetic material, such as 300 series stainless steel. A cathode 414 is made of magnetic material, such as carbon steel or 400 series steel. The combination of the electric field and the magnetic field creates the ions and accelerates them away from the ionization region 410, as represented by dashed beam lines 416, toward a target (e.g., a substrate). For open-field sources, additional magnets and pole pieces may be used to provide an extended acceleration zone to enhance low energy operation and stability. Sputtering of these extended components can also be a source of contamination.

However, some ions created at the ionization region 410 bombard the surface of the cathode 414 near the ionization region 410 (as well as other surfaces) and, therefore, sputter cathode material away from the ionization region 410, as represented by the exemplary directional arrows 418 and 420. The sputtered material enters the ion beam process as a contaminant, such as by reaching the surface of a substrate 422.

As can be seen in FIG. 4, the sputtered material corresponding to arrows 418 strikes the surfaces of the shields 404 and 406, and is effectively blocked from reaching the target substrate 422. In contrast, the sputtered material corresponding to the arrows 420 bypasses the shields 404 and 406 and may impinge the target substrate 422. However, the sputtered material corresponding to the arrows 420 remains within the envelope of the ion beam 416 and is therefore substantially etched away from the target substrate by the ion beam during processing. Accordingly, the separation between the shields (404 and 406) and the substrate path and the separation between and relative alignment between the shields (404 and 406) and the ionization regions 410 are set to block sputtered material that is emitted outside the ion beam envelope, while allowing the ion beam (and sputtered material emitted within the ion beam envelope) to pass to the target.

FIG. 5 illustrates a face of an ion source 500 with exemplary emitter shields. FIG. 6 illustrates a perspective view of the ion source 500 of FIG. 5 with exemplary emitter shields. An ion source 500 includes an oval ionization region 502 in which a working gas is ionized and from which ions are emitted. In operation, the ion source 500 emits ions from the ionization region 502 in the form of an ion beam. A substrate (not shown) is passed through the ion beam for processing (e.g., at some distance from the face of the ion source). In an exemplary embodiment, a substrate is transported along a path perpendicular to (or some other angle relative to) the long axis of the ion source 500, which emits an ion beam from the ionization region 502 toward the surface of the substrate as it passes.

It should be understood that some benefits may result for a non-perpendicular substrate path, including increasing power density, reducing overspray on a source longer than the width of the substrate, and smoothing out small longitudinal beam non-uniformities. There may also be benefits for a non-perpendicular angle of emission from the ion source and/or a non-perpendicular angle of ion impingement on the substrate. It should also be noted that the angle of the beam may be modified dynamically during the emission. Benefits may also be achieved from operating with the shields at some other electrical potential relative to the ion source housing (e.g., electrical isolation/floating and/or active biasing at a positive potential).

Emitter shields 504, 506, and 508 are positioned between the ion source 500 and the path of the substrate along the long channel portions of the ionization region 502. In various embodiments, one or two of the shields 504, 506, and 508 may be omitted. However, to best block sputtered contaminants from impinging the substrate surface after the substrate has passed through the ion beam, one of the shields is maintained on the far edge of the ion source (i.e., farthest in the direction of substrate motion). Nevertheless, each shield, singly or in combination with other shields, may decrease the total amount of sputtered contaminants reaching or remaining on the surface of the substrate, thereby improving substrate quality.

In the illustrated implementation, and in addition to emitter shields 504, 506, and 508, end shields 510 and 512 may be employed to block sputtered contaminants from the rounded ends of the ion source 500. Each end shield 510 and 512 may be configured (e.g. shaped, placed and sized) to block all emitted ions and sputtered contaminants emanating from the rounded ionization region 502 region in the ends of the ion source 500. For example, the end shields 510 and 512 may be much taller than the emitter shields 504, 506, and 508, which are sized to substantially pass the ion beam and substantially block the sputtered contaminants. Alternatively, the end shields 510 and 512 may be positioned, sized, and shaped to pass a portion of the ion beam and to substantially block the sputtered contaminants.

Figure 7:
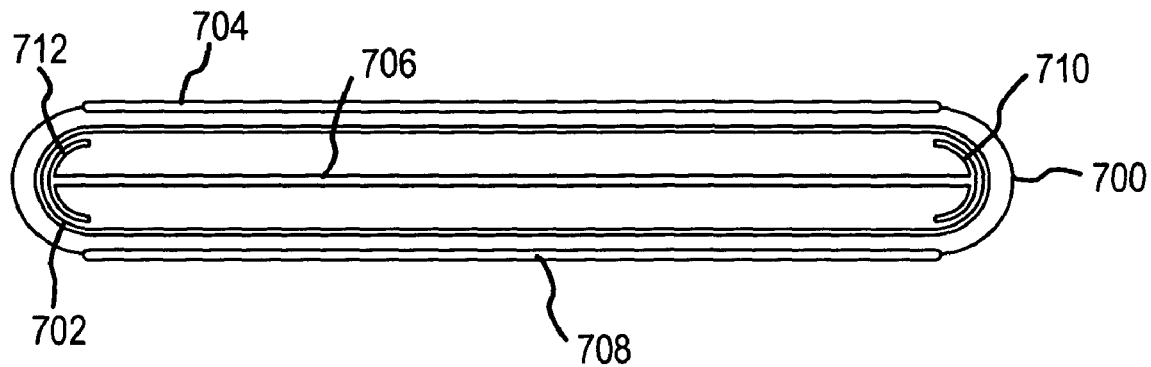
FIG. 7 illustrates a face of another ion source with exemplary emitter shields.
Figure 8:
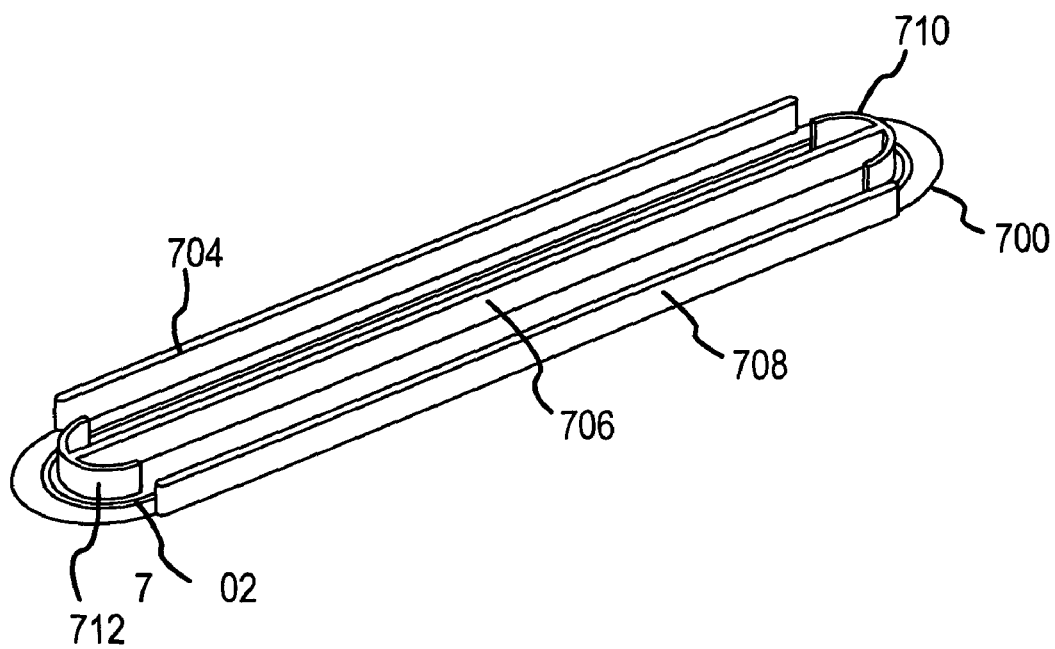
FIG. 8 illustrates a perspective view of the ion source of FIG. 7 with exemplary emitter shields.

FIG. 7 illustrates a face of another ion source 700 with exemplary emitter shields. FIG. 8 illustrates a perspective view of the ion source 700 of FIG. 7 with exemplary emitter shields. An ion source 700 includes an oval ionization region 702 in which a working gas is ionized. In operation, the ion source 700 emits ions from the ionization region 702 in the form of an ion beam. A substrate (not shown) is transported through the ion beam for processing (e.g., at some distance from the face of the ion source). In an exemplary embodiment, a substrate is transported along a path perpendicular to the long axis of the ion source 700, which emits an ion beam from the ionization region 702 toward the surface of the substrate as it passes.

Emitter shields 704, 706, and 708 are positioned between the ion source 700 and the path of the substrate along the long channel portions of the ionization region 702, as discussed with regard to FIGS. 5 and 6. Likewise, in various embodiments, one or two of the shields 504, 506, and 508 may be omitted.

In addition to emitter shields 704, 706, and 708, end shields 710 and 712 may be employed to block sputtered contaminants from the rounded ends of the ion source 700. The end shields 710 and 712 are shaped to improve the amount of the ion beam that is passed while substantially blocking the sputtered contaminants. The rounded shape substantially matches the rounded shape of the ionization region 702 at the ends of the ion source 700. In this configuration, the size and positioning of the end shields 710 and 712 are set to substantially pass the ion beam and to substantially block the sputtered contaminants from reaching the substrate.

The above specification, examples and data provide a complete description of the structure and use of exemplary embodiments of the invention. However, other implementations are also contemplated within the scope of the present invention, including without limitation shields having different shapes, sizes, and locations than those shown, as well as systems having one or more shields and systems with or without one or more end shields. In addition, while the description has described exemplary ion sources as ALSs, other ion sources may be employed within the scope of the invention. Since many implementations can be made without departing from the spirit and scope of the invention, the invention resides in the claims hereinafter appended.

What is claimed is:

1. An ion beam source system for processing a substrate along a substrate location, the ion beam source system comprising:

an ion beam source generating an ion beam in an ion beam envelope; and a shield positioned between the ion beam source and the substrate location to pass the ion beam envelope in a line-of-sight to the substrate location while blocking sputtered contaminants emanating from the ion beam source and projecting outside the ion beam envelope from impinging the substrate.

2. The ion beam source system of claim 1 wherein the ion beam source includes a cathode and generates sputtering ions, the sputtering ions sputtering the sputtered contaminants from the cathode.

3. The ion beam source system of claim 1 wherein the ion source includes an anode and generates sputtering ions, the sputtering ions sputtering the sputtered contaminants from the anode.

4. The ion beam source system of claim 1 wherein the substrate location is defined for passing the substrate though the ion beam envelope.

5. The ion beam source system of claim 1 wherein the ion beam source has a face and an ionization region, and the shield is positioned upright relative to the face of the ion beam source between long channels portions of the ionization region.

6. The ion beam source system of claim 1 wherein the ion beam source has a face and the shield is affixed to the ion beam source and is positioned upright relative to the face of the ion beam source between long channel portions of an ionization region of the ion beam source.

7. The ion beam source system of claim 1 wherein the ion beam source has a face and the shield is positioned upright relative to the face of the ion beam source along and outside a long channel portion of an ionization region of the ion beam source.

8. The ion beam source system of claim 1 wherein the ion beam source has a face and the shield is affixed to the ion beam source and is positioned upright relative to the face of the ion beam source along and outside a long channel portion of an ionization region of the ion beam source.

9. The ion beam source system of claim 1 wherein the substrate location is defined for passing the substrate through the ion beam envelope, and the shield is positioned adjacent to the substrate location to block the sputtered contaminants from impinging the substrate on at least a portion of the substrate location outside the ion beam envelope.

10. The ion beam source system of claim 1 wherein the ion beam source has a face, the substrate location is defined for passing the substrate through the ion beam envelope, and the shield is positioned substantially parallel to the face of the ion beam source and adjacent to the substrate location to block the sputtered contaminants from impinging the substrate on at least a portion of the substrate location outside the ion beam envelope.

11. The ion beam source system of claim 1 wherein the ion beam source includes an ionization region and at least one end section containing an end portion of the ionization region, the shield blocking sputtered contaminants emanating from the end portion of the ionization region from impinging the substrate.

12. The ion beam source system of claim 1 wherein the sputtered contaminants are sputtered from a surface of the ion beam source.

13. The ion beam source system of claim 1 wherein the ion beam source has an emission face from which the ion beam is emitted toward the substrate location and the emission face is parallel to a surface of the substrate.

14. The ion beam source system of claim 1 wherein the ion beam source has an emission face from which the ion beam is emitted in a normal direction from the emission face toward the substrate location and the emission face is parallel to a surface of the substrate.

15. The ion beam source system of claim 1 wherein the ion beam source has an emission face from which the ion beam is emitted in a non-normal direction from the emission face toward the substrate location and the emission face is parallel to a surface of the substrate.

16. The ion beam source system of claim 1 wherein the ion beam source has an emission face from which the ion beam is emitted toward the substrate location and the emission face is not parallel to a surface of the substrate.

17. The ion beam source system of claim 1 wherein the ion beam source has an emission face from which the ion beam is emitted in a normal direction from the emission face toward the substrate location and the emission face is not parallel to a surface of the substrate.

18. The ion beam source system of claim 1 wherein the ion beam source has an emission face from which the ion beam is emitted in a non-normal direction from the emission face toward the substrate location and the emission face is not parallel to a surface of the substrate.

19. The ion beam source system of claim 1 wherein the shield is actively biased.

20. The ion beam source system of claim 1 wherein the shield is actively biased to a positive potential.

21. The ion beam source system of claim 1 wherein the shield is electrically isolated from the ion beam source.

22. The ion beam source system of claim 1 wherein the shield comprises a process-compatible material.

23. The ion beam source system of claim 1 wherein the shield comprises a contaminant-trapping material.

24. The ion beam source system of claim 1 wherein the ion beam source has a face and wherein a distance between the ion beam source and the substrate location, in a direction perpendicular to the face of the ion beam source, is between 50 mm and 300 mm.

25. The ion beam source system of claim 1 wherein the ion beam projects divergently from the ion beam source.

26. A shielding system positionable between an ion beam source and a substrate location that passes an ion beam in an ion beam envelope from the ion beam source in a line-of-sight to impinge a substrate on the substrate location while blocking sputtered contaminants emanating from the ion beam source and projecting outside the ion beam envelope from impinging the substrate.

27. The shielding system of claim 26 wherein the sputtered contaminants are sputtered from a cathode of the ion beam source.

28. The shielding system of claim 26 wherein the sputtered contaminants are sputtered from an anode of the ion beam source.

29. The shielding system of claim 26 wherein the substrate location is defined for passing the substrate through the ion beam.

30. The shielding system of claim 26 wherein the ion beam source includes a cathode and an ionization region that generates the ion beam and sputtering ions, and the sputtering ions sputter the sputtered contaminant from the cathode toward the substrate location.

31. The shielding system of claim 26 wherein the ion beam source has a face and an ionization region, and the shielding system includes a shield positioned upright relative to the face of the ion beam source between long channel portions of the ionization region of the ion beam source.

32. The shielding system of claim 26 wherein the ion beam source has a face and an ionization region, and the shielding system includes a shield affixed to the ion beam source and positioned upright relative to the face of the ion beam source between long channel portions of the ionization region of the ion beam source.

33. The shielding system of claim 26 wherein the ion beam source has a face and an ionization region, and the shielding system includes a shield positioned upright relative to the ion beam source along and outside a long channel portion of the ionization region of the ion beam source.

34. The shielding system of claim 26 wherein the ion beam source has a face and an ionization region, and the shielding system includes a shield affixed to the ion beam source and positioned upright relative to the ion beam source along and outside a long channel portion of the ionization region of the ion beam source.

35. The shielding system of claim 26 wherein the substrate location is defined to pass the substrate though the ion beam envelope and the shielding system includes a shield positioned adjacent to the substrate location to block the sputtered contaminants from impinging the substrate on at least a portion of the substrate location outside the ion beam envelope.

36. The shielding system of claim 26 wherein the ion beam source includes an ionization region and at least one end section containing an end portion of the ionization region, and the shielding system includes an end shield to block sputtered contaminants emanating from the end portion of the ionization region from impinging the substrate.

37. The shielding system of claim 26 wherein the sputtered contaminants are sputtered from a surface of the ion beam source.

38. The shielding system of claim 26 wherein the ion beam source has an emission face from which the ion beam is emitted toward the substrate location and the emission face is parallel to a surface of the substrate.

39. The shielding system of claim 26 wherein the ion beam source has an emission face from which the ion beam is emitted in a normal direction from the emission face toward the substrate location and the emission face is parallel to a surface of the substrate.

40. The shielding system of claim 26 wherein the ion beam source has an emission face from which the ion beam is emitted in a non-normal direction from the emission face toward the substrate location and the emission face is parallel to a surface of the substrate.

41. The shielding system of claim 26 wherein the ion beam source has an emission face from which the ion beam is emitted toward the substrate location and the emission face is not parallel to a surface of the substrate.

42. The shielding system of claim 26 wherein the ion beam source has an emission face from which the ion beam is emitted in a normal direction from the emission face toward the substrate location and the emission face is not parallel to a surface of the substrate.

43. The shielding system of claim 26 wherein the ion beam source has an emission face from which the ion beam is emitted in a non-normal direction from the emission face toward the substrate location and the emission face is not parallel to a surface of the substrate.

44. The shielding system of claim 26 wherein the shielding system is actively biased.

45. The shielding system of claim 26 wherein the shielding system is actively biased to a positive potential.

46. The shielding system of claim 26 wherein the shielding system is electrically isolated from the ion beam source.

47. The shielding system of claim 26 wherein the shielding system comprises a process-compatible material.

48. The shielding system of claim 26 wherein the shielding system comprises a contaminant-trapping material.

49. The shielding system of claim 26 wherein the ion beam source has a face and wherein a distance between the ion beam source and the substrate location, in a direction perpendicular to the face of the ion beam source, is between 50 mm and 300 mm.

50. The shielding system of claim 26 wherein the ion beam projects divergently from the ion beam source.

\* \* \* \* \*

UNITED STATES PATENT AND TRADEMARK OFFICE
CERTIFICATE OF CORRECTION

PATENT NO. : 7,718,983 B2  Page 1 of 1
APPLICATION NO. : 10/918865
DATED : May 18, 2010
INVENTOR(S) : David Matthew Burtner et al.

It is certified that error appears in the above-identified patent and that said Letters Patent is hereby corrected as shown below:

Page 2, Column 2, line 20, delete "Interent" and insert --Internet--, therefor.

Column 9, line 6, delete "though" and insert --through--, therefor.

Column 10, line 46, delete "beam." and insert --beam envelope.--, therefor.

Column 11, line 8, delete "though" and insert --through--, therefor.

Signed and Sealed this

Seventeenth Day of August, 2010

David J. Kappos
*Director of the United States Patent and Trademark Office*